US012677545B2

(12) United States Patent
Wang et al.

(10) Patent No.: US 12,677,545 B2
(45) Date of Patent: Jul. 7, 2026

(54) ARRAY SUBSTRATE AND METHOD FOR MANUFACTURING SAME, DISPLAY PANEL AND DISPLAY DEVICE

(71) Applicant: BOE Technology Group Co., Ltd., Beijing (CN)

(72) Inventors: Dongfang Wang, Beijing (CN); Wei Liu, Beijing (CN); Jie Huang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 740 days.

(21) Appl. No.: 17/924,845

(22) PCT Filed: Dec. 29, 2021

(86) PCT No.: PCT/CN2021/142698
§ 371 (c)(1),
(2) Date: Nov. 11, 2022

(87) PCT Pub. No.: WO2023/123125
PCT Pub. Date: Jul. 6, 2023

(65) Prior Publication Data
US 2024/0306438 A1     Sep. 12, 2024

(51) Int. Cl.
| | |
|---|---|
| *H10K 59/124* | (2023.01) |
| *H10D 30/01* | (2025.01) |
| *H10D 30/67* | (2025.01) |
| *H10D 86/40* | (2025.01) |
| *H10K 59/12* | (2023.01) |
| *H10K 59/121* | (2023.01) |

(52) U.S. Cl.
CPC ....... *H10K 59/124* (2023.02); *H10D 30/0312* (2025.01); *H10D 30/67* (2025.01); *H10D 30/6734* (2025.01); *H10D 86/431* (2025.01); *H10D 86/471* (2025.01); *H10K 59/1201* (2023.02); *H10K 59/1213* (2023.02)

(58) Field of Classification Search
None
See application file for complete search history.

(56) References Cited

U.S. PATENT DOCUMENTS

| | | | | |
|---|---|---|---|---|
| 12,113,073 B2 * | 10/2024 | Huang | ................. | H10D 86/423 |
| 2002/0117719 A1 | 8/2002 | Ando et al. | | |
| 2015/0069335 A1 * | 3/2015 | Hsu | ........................ | H10D 86/60 |
| | | | | 438/23 |
| 2016/0260744 A1 * | 9/2016 | Jiang | ................. | H10D 30/6739 |

(Continued)

FOREIGN PATENT DOCUMENTS

| | | |
|---|---|---|
| CN | 104167449 A | 11/2014 |
| CN | 108288606 A | 7/2018 |

(Continued)

*Primary Examiner* — Christine S. Kim
*Assistant Examiner* — Tien Tran
(74) *Attorney, Agent, or Firm* — IPro, PLLC

(57) ABSTRACT

Provided is an array substrate. The array substrate includes a base substrate and a driving thin-film transistor disposed on the base substrate. The driving thin-film transistor includes a first gate, a first insulating layer, a first active layer, a second insulating layer, and a first source/drain electrode which are sequentially laminated on the base substrate. The thickness of the first insulating layer is greater than the thickness of the second insulating layer.

17 Claims, 5 Drawing Sheets

(56)     References Cited

U.S. PATENT DOCUMENTS

| | | | |
|---|---|---|---|
| 2017/0213883 A1 | 7/2017 | Zhang | |
| 2017/0309649 A1* | 10/2017 | Hayashi | H10D 86/425 |
| 2019/0386083 A1* | 12/2019 | Liu | H10D 86/423 |
| 2022/0059576 A1 | 2/2022 | Zhao et al. | |
| 2023/0317732 A1* | 10/2023 | Takechi | H10D 86/423 |
| 2025/0275240 A1* | 8/2025 | Kwak | H10D 86/423 |

FOREIGN PATENT DOCUMENTS

| | | | | |
|---|---|---|---|---|
| CN | 110880518 A | 3/2020 | | |
| CN | 112259553 A | 1/2021 | | |
| IN | 105489615 A | 4/2016 | | |
| KR | 20190080207 A | * | 7/2019 | H01L 27/3258 |

* cited by examiner

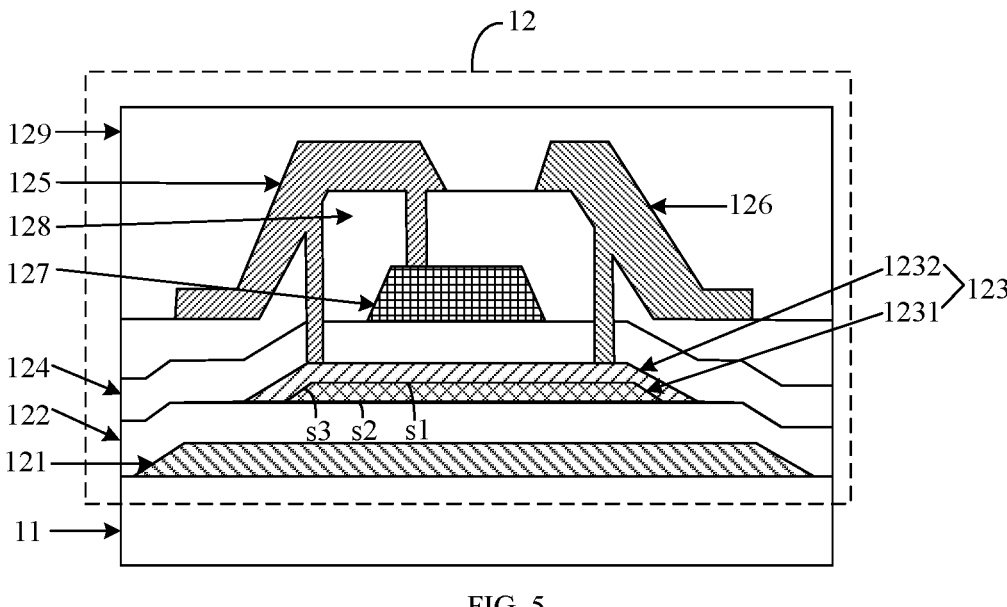

FIG. 5

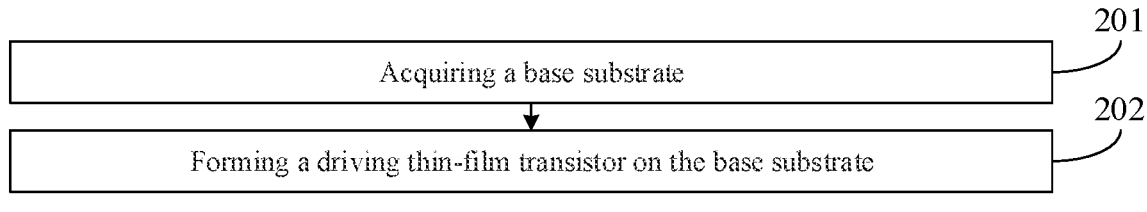

| Acquiring a base substrate | 201 |
| Forming a driving thin-film transistor on the base substrate | 202 |

FIG. 6

| Sequentially forming a first gate and a first insulating layer which are laminated | 2021 |
| Forming a first active layer on the first insulating layer | 2022 |
| Sequentially forming a second insulating layer and a first source/drain electrode on the base substrate on which the first active layer is formed | 2023 |

FIG. 7

ARRAY SUBSTRATE AND METHOD FOR MANUFACTURING SAME, DISPLAY PANEL AND DISPLAY DEVICE

CROSS-REFERENCE TO RELATED APPLICATION

The present disclosure is a U.S. national stage of international application No. PCT/CN2021/142698, filed on Dec. 29, 2021, the disclosure of which is incorporated herein by reference in its entirety.

TECHNICAL FIELD

The present disclosure relates to the field of display technologies, and in particular relates to an array substrate and a method for manufacturing the same, a display panel and a display device.

BACKGROUND

Currently, organic light-emitting diode (OLED) display panels have the characteristics of high contrast, wide color gamut, fast response speed, and the like. An array substrate is a component in display panel and is configured to control display panel. Indium gallium zinc oxides (IGZO) are widely used in preparing an active layer of a thin-film transistor (TFT) in an array substrate due to their advantages of high mobility, good uniformity, good transparency and the like.

SUMMARY

Embodiments of the present disclosure provide an array substrate and a method for manufacturing the same, a display panel and a display device. The technical solutions are as follows.

According to some embodiments of the present disclosure, an array substrate is provided. The array substrate includes: a base substrate and a driving thin-film transistor disposed on the base substrate, wherein the driving thin-film transistor includes a first gate, a first insulating layer, a first active layer, a second insulating layer, and a first source/drain electrode which are sequentially laminated on the base substrate, a thickness of the first insulating layer being greater than a thickness of the second insulating layer.

In some embodiments, the array substrate further includes a switching thin-film transistor disposed on the base substrate, wherein the switching thin-film transistor includes a second active layer, a third insulating layer, a second gate, and a second source/drain electrode which are sequentially laminated on the base substrate, the third insulating layer and the second insulating layer being disposed in a same layer.

In some embodiments, a ratio of the thickness of the first insulating layer to the thickness of the second insulating layer ranges from 1.2 to 5.

In some embodiments, the driving thin-film transistor further includes a conductive structure disposed between the second insulating layer and the first source/drain electrode, wherein an orthographic projection of the conductive structure on the base substrate is overlapped with an orthographic projection of the first gate on the base substrate; and the first source/drain electrode includes a first electrode electrically connected with a power supply and a second electrode electrically connected with a light-emitting unit, the second electrode being electrically connected with the conductive structure.

In some embodiments, the first active layer includes a first semiconductor layer and a second semiconductor layer sequentially laminated in a direction away from the base substrate, wherein a mobility of the first semiconductor layer is greater than a mobility of the second semiconductor layer.

In some embodiments, the second semiconductor layer covers a surface of the first semiconductor layer away from the base substrate.

In some embodiments, the first semiconductor layer includes a top surface and a bottom surface which are opposite to each other, and a side surface connecting the top surface and the bottom surface, the bottom surface facing towards the base substrate; and the second semiconductor layer covers the top surface and the side surface of the first semiconductor layer.

In some embodiments, the mobility of the first semiconductor layer ranges from 20 cm/V·s) to 100 cm$^2$/(V·s) and the mobility of the second semiconductor layer ranges from 5 cm$^2$/(V·s) to 30 cm$^2$/(V·s).

According to some embodiments of the present disclosure, a method for manufacturing an array substrate is provided. The method includes:

acquiring a base substrate;

forming a driving thin-film transistor on the base substrate;

wherein forming the driving thin-film transistor includes:

sequentially forming a first gate and a first insulating layer which are laminated;

forming a first active layer on the first insulating layer; and sequentially forming a second insulating layer and a first source/drain electrode on the base substrate on which the first active layer is formed;

wherein a thickness of the first insulating layer is greater than a thickness of the second insulating layer.

In some embodiments, forming the first active layer on the first insulating layer includes:

forming the first active layer on the base substrate on which the first insulating layer is formed in an environment with an oxygen concentration greater than or equal to 20%.

In some embodiments, forming the first active layer on the first insulating layer includes:

sequentially forming a first semiconductor material layer and a second semiconductor material layer on the base substrate on which the first insulating layer is formed; and performing a one-time patterning process on the first semiconductor material layer and the second semiconductor material layer to form a first semiconductor layer and a second semiconductor layer;

wherein the second semiconductor layer covers a surface of the first semiconductor layer away from the base substrate.

According to some embodiments of the present disclosure, a display panel is provided. The display panel includes the array substrate as described above.

According to some embodiments of the present disclosure, a display device is provided. The display device includes the display panel as described above.

BRIEF DESCRIPTION OF THE DRAWINGS

For clearer descriptions of the technical solutions in the embodiments of the present disclosure, the following briefly introduces the accompanying drawings required for describing the embodiments. The accompanying drawings in the following description show merely some embodiments of the present disclosure, and a person of ordinary skill in the art may still derive other drawings from these accompanying drawings without creative effort.

FIG. 5 is a schematic structural diagram of still another array substrate according to some embodiments of the present disclosure;

FIG. 6 is a flowchart of a method for manufacturing an array substrate according to some embodiments of the present disclosure;

FIG. 7 is a flowchart of a method for forming a driving thin-film transistor in the method shown in FIG. 6;

Figure 1:
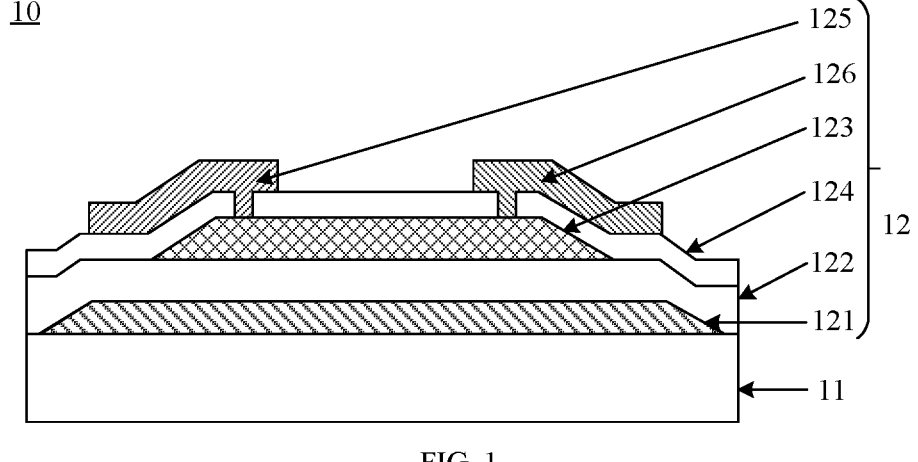
FIG. 1 is a schematic structural diagram of an array substrate according to some embodiments of the present disclosure.

Specific embodiments of the present disclosure are illustrated with reference to the accompanying drawings, and will be described in more detail hereinafter. These drawings and the descriptions are not intended to limit the scope of the concepts of the present disclosure in any way, but rather illustrate the concepts of the present disclosure to those skilled in the art by reference to specific embodiments.

DETAILED DESCRIPTION

The embodiments of the present disclosure will be described in further detail with reference to the accompanying drawings, to present the objectives, technical solutions, and advantages of the present disclosure more clearly.

OLED display panels have the characteristics of high contrast, wide color gamut, fast response speed, and the like. An array substrate is a component in display panel and is configured to control the display panel.

The driving thin-film transistor on the array substrate is a main driving element in the OLED display panel. Indium gallium zinc oxides are widely used in preparing an active layer of a thin-film transistor in the array substrate due to their advantages of high mobility, good uniformity, good transparency, and the like.

The OLED display panel is provided with a plurality of pixels arranged in an array, and each pixel is driven by one pixel driving circuit on the array substrate. In some example embodiments, the array substrate includes a driving thin-film transistor and a switching thin-film transistor. The switching thin-film transistor is used as a switch of the OLED, and the driving thin-film transistor is used to adjust the grayscale the OLED.

Since the driving thin-film transistor and the switching thin-film transistor have different functions in the display panel, the requirements on the electrical properties of the driving thin-film transistor and the switching thin-film transistor are also different. For example, the subthreshold swing (ss) of the switching thin-film transistor is small, such that the switching thin-film transistor is turned on or turned off quickly, so as to turn off the light-emitting device. The subthreshold swing of the driving thin-film transistor is large, so as to prevent the grayscale adjustment range of the light-emitting device from being too small.

The subthreshold swing is a performance indicator of the switching rate between an on-state and an off-state of the thin-film transistor. The subthreshold swing represents the variation in the gate voltage required for a tenfold variation of the source/drain current, and is also referred to as an S-factor. The smaller the S-factor is, the faster the thin-film transistor is turned on or turned off.

However, since the switching thin-film transistor and the driving thin-film transistor on the array substrate in the related art are manufactured simultaneously, the switching thin-film transistor and the driving thin-film transistor are similar in structure, and the thicknesses of the various film layers in the switching thin-film transistor and driving thin-film transistor are equal, resulting in the subthreshold swing of the switching thin-film transistor being approximate to the subthreshold swing of the driving thin-film transistor. That is, the subthreshold swing of the driving thin-film transistor is small, resulting in the poor performance of the driving thin-film transistor in adjusting the grayscale the OLED.

Part or all of the above technical problems can be optimized by the following limited embodiments of the present disclosure.

The array substrate according to the embodiments of the present disclosure is applicable to the display field or chip field. The display field includes the field of liquid crystal display (LCD) panels, the field of organic light-emitting diode (OLED) display panels, the field of quantum dot light emitting diode (QLED) display panels, the field of micro light-emitting diode (Micro LED) display panels, the field of sensing technologies and the like.

FIG. 1 is a schematic structural diagram of an array substrate according to some embodiments of the present disclosure. Referring to FIG. 1, the array substrate 10 includes a base substrate 11 and a driving thin-film transistor 12 on the base substrate 11. The driving thin-film transistor 12 is connected with a light-emitting device on a display panel. The driving thin-film transistor 12 is turned on when the display panel is turned on, to drive the driving current of the light-emitting device on the display panel to enter the light-emitting device through the driving thin-film transistor 12, thereby driving the light-emitting device on the display panel to emit light.

The driving thin-film transistor 12 includes a first gate 121, a first insulating layer 122, a first active layer 123, a second insulating layer 124, and a first source/drain electrode (for ease of understanding, a first source 125 and a first drain 126 represent the first source/drain electrode in the present disclosure) which are sequentially lamented on the base substrate 11. That is, the first gate 121 is disposed on a side of the base substrate 11, the first insulating layer 122 is disposed on the side of the first gate 121 away from the base substrate 11, the first active layer 123 is disposed on the side of the first insulating layer 122 away from the base substrate 11, the second insulating layer 124 is disposed on the side of the first active layer 123 away from the base substrate 11, and the first source/drain electrode (the first source 125 and the first drain 126) is disposed on the side of the second insulating layer 124 away from the base substrate 11.

Referring to FIG. 1, the first source 125 and the first drain 126 are disposed in the same layer and are prepared by the same patterning process. The first source 125 and the first drain 126 are both electrically connected with the first active layer 123. The first active layer 123 includes a metal oxide semiconductor layer.

The thickness of the first insulating layer 122 is greater than the thickness of the second insulating layer 124. In example embodiments, the thickness of the first insulating layer 122 is twice the thickness of the second insulating layer 124. In the embodiments of the present disclosure, the first insulating layer 122 serves as a gate insulating layer of the driving thin-film transistor 12. Different from the related art, in the array substrate in which the driving thin-film transistor has a top-gate structure, the second insulating layer 124 serves as the gate insulating layer of the driving thin-film transistor. In the embodiments of the present disclosure, the first insulating layer 122 serving as the gate insulating layer is relatively thicker, such that the first gate 121 of the driving thin-film transistor 12 has a weak gate-control ability over the first active layer 123. Therefore, the subthreshold swing of the driving thin-film transistor 12 is increased, and the light-emitting device connected with the driving thin-film transistor 12 has a wider grayscale adjustment range.

Furthermore, the subthreshold swing of the driving thin-film transistor 12 is negatively correlated with the capacitance of the gate insulating layer, and the capacitance of gate insulating layer is negatively correlated with the thickness of the gate insulating layer. Therefore, the subthreshold swing of the driving thin-film transistor 12 is positively correlated with the thickness of the gate insulating layer. In addition, the change in the thickness of the first insulating layer 122 has a small influence on the electrical properties of other devices on the array substrate 10. Therefore, according to the embodiments of the present disclosure, the subthreshold swing of the driving thin-film transistor 12 is adjusted by adjusting the thickness of the first insulating layer 122 serving as the gate insulating layer.

In summary, the present disclosure provides an array substrate. The array substrate includes a base substrate and a driving thin-film transistor disposed on the base substrate. The driving thin-film transistor includes a first gate, a first insulating layer, a first active layer, a second insulating layer, and a first source/drain electrode which are sequentially laminated on the base substrate. The thickness of the first insulating layer is greater than the thickness of the second insulating layer. Therefore, the regulating ability of the first gate of the driving thin-film transistor over the first active layer is reduced, and the subthreshold swing of the driving thin-film transistor is increased, thereby improving the adjusting ability of the driving thin-film transistor over the grayscale of the light-emitting device on the display panel.

Figure 2:
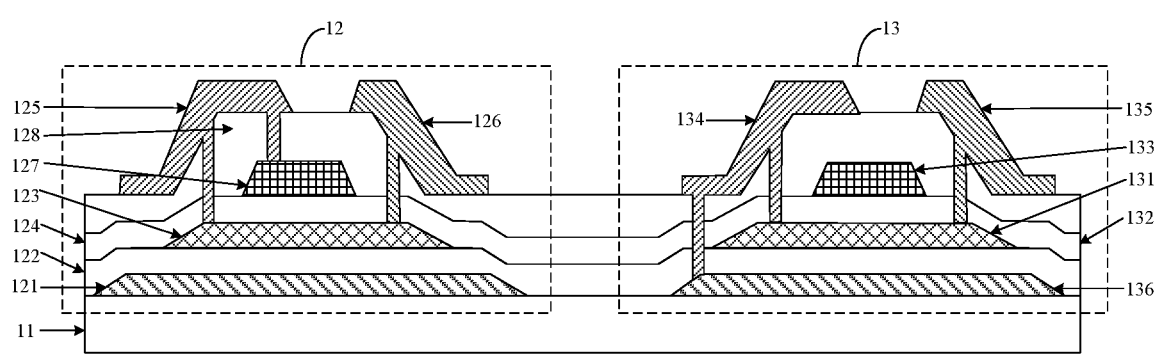
FIG. 2 is a schematic structural diagram of another array substrate according to some embodiments of the present disclosure.

Optionally, FIG. 2 is a schematic structural diagram of another array substrate according to some embodiments of the present disclosure. As shown in FIG. 2, the array substrate 10 further includes a switching thin-film transistor 13 disposed on the base substrate 11. The switching thin-film transistor 13 includes a second active layer 131, a third insulating layer 132, a second gate 133, and a second source/drain electrode (for ease of understanding, in the embodiments of the present disclosure, a second source 134 and a second drain 135 represent the second source/drain electrode, the second source 134 and the second drain 135 are disposed in the same layer, prepared by the same patterning process, and both electrically connected with the second active layer 131) which are sequentially laminated on the base substrate 11. That is, the second active layer 131 is disposed on a side of the base substrate 11, the third insulating layer 132 is disposed on the side of the second active layer 131 away from the base substrate 11, the second gate 133 is disposed on the side of the third insulating layer 132 away from the base substrate 11, and the second source/drain electrode (the second source 134 and the second drain 135) is disposed on the side of the second gate 133 away from the base substrate 11. The second active layer 131 includes a metal oxide semiconductor layer.

The third insulating layer 132 and the second insulating layer 124 are disposed in the same layer. Furthermore, the third insulating layer 132 and the second insulating layer 124 are the same insulating layer, and formed at one time during preparation of the array substrate. As such, the thickness of the third insulating layer 132 is equal to the thickness of the second insulating layer 124, and the thickness of the third insulating layer 132 is smaller than the thickness of the first insulating layer 122, such that the second gate 133 of the switching thin-film transistor 13 has a high gate-control ability over the second active layer 131. Therefore, the subthreshold swing of the switching thin-film transistor 13 is smaller than the subthreshold swing of the driving thin-film transistor 12, thereby improving the rate at which the thin-film transistor is turned on or turned off.

Optionally, the switching thin-film transistor 13 further includes a light-shielding metal layer 136 on the side of the second active layer 131 proximal to the base substrate 11. The light-shielding metal layer 136 is configured to prevent ambient light beams from affecting the stability of the second active layer 131. The light-shielding metal layer 136 is disposed in the same layer and formed by the same patterning process as the first gate 121.

Optionally, referring to FIG. 1 or FIG. 2, the ratio of the thickness of the first insulating layer 122 to the thickness of the second insulating layer 124 ranges from 1.2 to 5. Illustratively, the thickness of the first insulating layer 122 ranges from 2000 angstroms to 5000 angstroms, and the thickness of the second insulating layer 124 ranges from 800 angstroms to 2000 angstroms. Within these ranges, in the embodiments of the present disclosure, the first gate 121 of the driving thin-film transistor 12 is disposed on the side of the first active layer 123 proximal to the base substrate 11 such that the first insulating layer 122 serving as the gate insulating layer of the driving thin-film transistor 12 is relatively thick, and the second gate 133 of the switching thin-film transistor 13 is disposed on the side of the second active layer 131 away from the base substrate 11 such that the third insulating layer 132 serving as the gate insulating layer of the switching thin-film transistor 13 is relatively thick. In this way, the subthreshold swing of the driving thin-film transistor 12 in the array substrate 10 is relatively large and the subthreshold swing of the switching thin-film transistor 13 in the array substrate 10 is relatively small.

Optionally, as shown in FIG. 2, the driving thin-film transistor 12 further includes a conductive structure 127 disposed between the second insulating layer 124 and the first source/drain electrode (the first source 125 and the first drain 126), and the orthographic projection of the conductive structure 127 on the base substrate 11 is overlapped with the orthographic projection of the first gate 121 on the base substrate 11. The material of the conductive structure 127 includes metal. The conductive structure 127 is disposed on the side of the first active layer 123 away from the base substrate 11, and the orthographic projection the conductive structure 127 on the base substrate 11 is overlapped with the orthographic projection the first active layer 123 on the base substrate 11, which can prevent ambient light from affecting the first active layer 123, thereby improving the stability of the first active layer 123.

The first source/drain electrode (the first source 125 and the first drain 126) includes a first electrode which is electrically connected with a power supply and a second electrode which is electrically connected with a light-emitting unit. The second electrode is electrically connected with the conductive structure 127. Optionally, as shown in FIG. 2, the driving thin-film transistor 12 further includes a fourth insulating layer 128 disposed between the conductive structure 127 and the first source/drain electrode (the first source 125 and the first drain 126), and the fourth insulating layer 128 is referred to as an interlayer dielectric (ILD). The fourth insulating layer 128 is provided with a plurality of through holes, and the second insulating layer 124 is also provided with a plurality of through holes. The first electrode is connected with the first active layer 123 via the through holes in the fourth insulating layer 128 and the second insulating layer 124, the second electrode is connected with the first active layer 123 via the through holes in the fourth insulating layer 128 and the second insulating layer 124, and the second electrode is connected with the conductive structure 127 via the through holes in the fourth insulating layer 128.

In example embodiments, as shown in FIG. 2, the first electrode is the first drain 126, the second electrode is the first source 125, and the conductive structure 127 is connected with the first source 125, such that an electric field is formed between the first gate 121 and the conductive structure 127, and an electric field is also formed between the conductive structure 127 and the first drain 126. The electric fields can increase the thickness of a depletion layer in the first active layer 123 near the first drain 126, such that the source/drain voltage of the driving thin-film transistor 12 (the voltage between the first drain 126 and the first source 125) varies within a certain range in a short period of time, and the drain current of the driving thin-film transistor 12 (the current of the first drain 126) remains approximately constant in a short period of time. Therefore, the driving thin-film transistor 12 is in an output stage in a saturated working area quickly, thereby improving the stability of the driving thin-film transistor 12.

Figure 3:
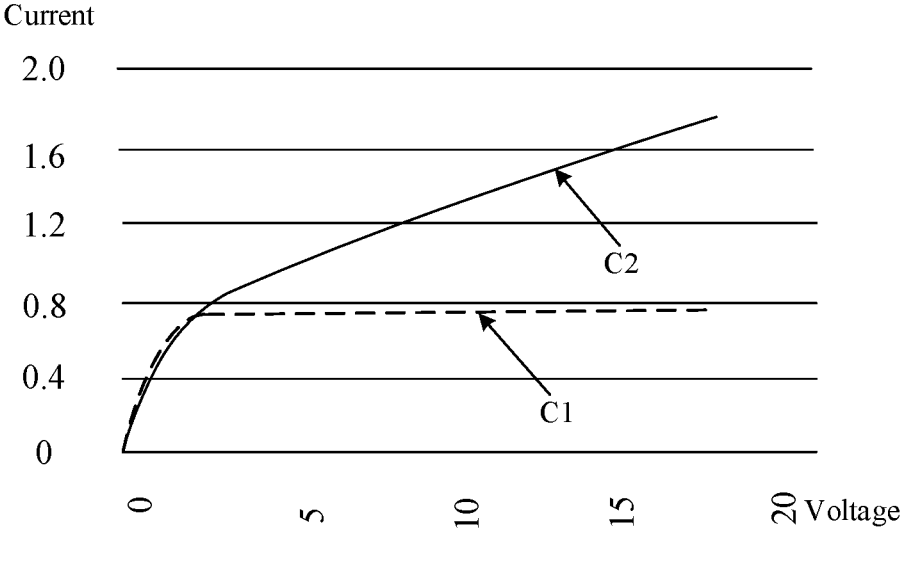
FIG. 3 is a comparison diagram between an output characteristic curve of a driving thin-film transistor in some embodiments of the present disclosure and an output characteristic curve of a driving thin-film transistor in the related art.

In example embodiments, FIG. 3 is a comparison diagram between an output characteristic curve of a driving thin-film transistor in some embodiments of the present disclosure and an output characteristic curve of a driving thin-film transistor in the related art. In FIG. 3, the abscissa represents the source/drain voltage, in volts (V), and the ordinate represents the drain current, in amperes (A). The output characteristic curve of the driving thin-film transistor mainly includes the following four regions: a variable resistance region, a saturation region, a cutoff region, and a breakdown region. The saturation region refers to the portion of the output characteristic curve of the driving thin-film transistor where the drain/source voltage V (ds) is greater, and the drain current I (d) does not change with the increase of V (ds). Within the saturation region, the magnitude of the drain current I (d) is controlled only by the gate/source voltage (the voltage between the gate and the source), and the output characteristic of the driving thin-film transistor is relatively stable.

In FIG. 3, curve C1 shows a change curve of the drain current with the source/drain voltage in the output characteristic curve of the driving thin-film transistor 12 in the embodiments of the present disclosure, and curve C2 shows a change curve of the drain current with the source/drain voltage in the output characteristic curve of the driving thin-film transistor without the conductor structure 127 in the related art. As can be seen in FIG. 3, the driving thin-film transistor in the embodiments of the present disclosure can reach the state of the saturation region faster than the driving thin-film transistor in the related art, that is, the electrical stability of the driving thin-film transistor in the present disclosure is better.

Optionally, as shown in FIG. 2, the conductive structure 127 is disposed in the same layer as the second gate 133 of the switching thin-film transistor 13, and the conductive structure 127 and the second gate 133 are formed by a one-time patterning process.

Figure 4:
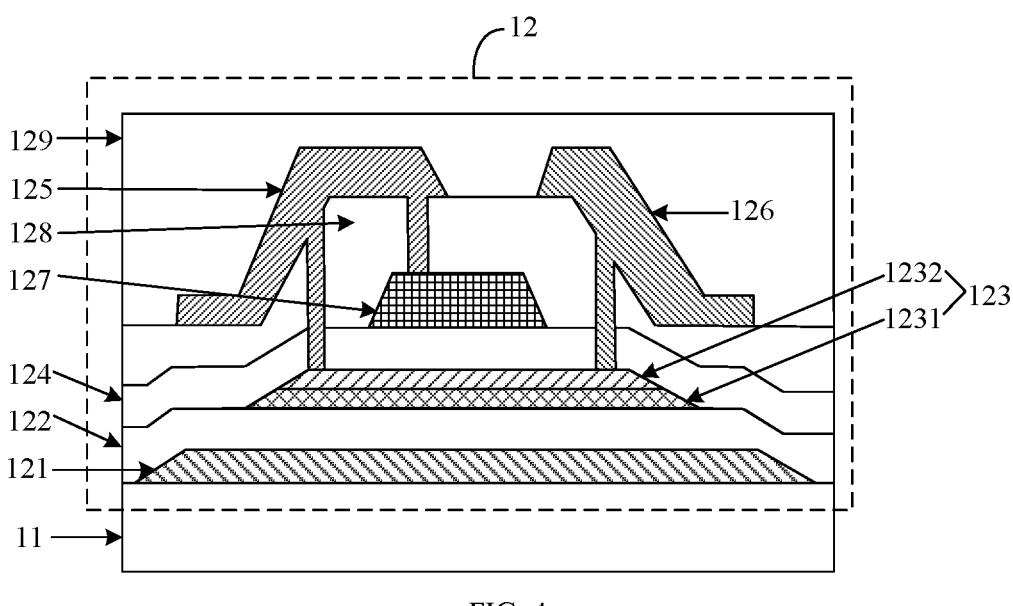
FIG. 4 is a schematic structural diagram of still another array substrate according to some embodiments of the present disclosure.

Optionally, as shown in FIG. 4, FIG. 4 is a schematic structural diagram of another array substrate according to some embodiments of the present disclosure. The first active layer 123 includes a first semiconductor layer 1231 and a second semiconductor layer 1232 sequentially laminated in the direction away from the base substrate 11. The first active layer 123 is a laminated structure, and the first source 125 and the first drain 126 are both electrically connected with the second semiconductor layer 1232.

The mobility of the first semiconductor layer 1231 is greater than the mobility of the second semiconductor layer 1232. For semiconductor layers made from the same kind of materials, the thin-film transistor adopting the semiconductor layer with a lower mobility has a larger subthreshold swing, and the thin-film transistor adopting the semiconductor layer with a higher mobility has a smaller subthreshold swing. Therefore, in the case that the first active layer 123 is a laminated structure, the subthreshold swing of the driving thin-film transistor 12 is increased under the premise that the first active layer 123 has a higher mobility.

In addition, the second semiconductor layer 1232 with the lower mobility can also improve the short channel effect of the first active layer 123.

Optionally, as shown in FIG. 4, the second semiconductor layer 1232 covers the surface of the first semiconductor layer 1231 away from the base substrate 11. As such, the first semiconductor layer 1231 and the second semiconductor layer 1232 are formed by the one-time patterning process, which can simplify the preparation process of the array substrate 10.

Optionally, as shown in FIG. 5, FIG. 5 is a schematic structural diagram of still another array substrate according to some embodiments of the present disclosure. The array substrate shown in FIG. 5 is obtained after some adjustments are made to the array substrate shown in FIG. 4. The first semiconductor layer 1231 has a top surface s1 and a bottom surface s2 which are opposite to each other, and a side surface s3 connecting the top surface s1 and the bottom surface s2. The bottom surface s2 face towards the base substrate 11. The first semiconductor layer 1231 has a lower mobility and is more stable than the second semiconductor layer 1232, and the second semiconductor layer 1232 covers the top surface s1 and the side surface s3 of the first semiconductor layer 1231, which can further improve the stability of the active layer.

Optionally, the mobility of the first semiconductor layer 1231 ranges from 20 cm²/(V·s) to 100 cm²/(V·s), and the mobility of the second semiconductor layer 1232 ranges from 5 cm²/(V·s) to 30 cm²/(V·s). The material of the first semiconductor layer 1231 and the material of the second semiconductor layer 1232 each include one of indium gallium zinc oxide (IGZO), indium tin oxide (ITO), and indium zinc oxide (IZO).

Optionally, as shown in FIG. 5, the driving thin-film transistor 12 further includes a fifth insulating layer 129. The fifth insulating layer 129 includes at least one of a passivation layer (PVX) or a planarization layer (PLN). The fifth insulating layer 129 is configured to protect the first source/drain electrode (the first drain 126 and the first source 125).

In summary the present disclosure provides an array substrate. The array substrate includes a base substrate and a driving thin-film transistor disposed on the base substrate. The driving thin-film transistor includes a first gate, a first insulating layer, a first active layer, a second insulating layer, and a first source/drain electrode which are sequentially laminated on the base substrate. The thickness of the first insulating layer is greater than the thickness of the second insulating layer. Therefore, the regulating ability of the first gate of the driving thin-film transistor over the first active layer is reduced, and the subthreshold swing of the driving thin-film transistor is increased, thereby improving the adjusting ability of the driving thin-film transistor over the grayscale of the light-emitting device on the display panel.

FIG. 6 is a flowchart of a method for manufacturing array substrate according to some embodiments of the present disclosure. The method is applicable to manufacturing the array substrates provided in the above embodiments, for example, the array substrate show % n in FIG. 1.

Referring to FIG. 6, the method includes the following steps.

In step 201, a base substrate is acquired.

In step 202, a driving thin-film transistor is formed on the base substrate.

Referring to FIG. 7, step 202 includes the following three sub-steps.

In sub-step 2021, a first gate and a first insulating layer which are laminated are sequentially formed.

In sub-step 2022, a first active layer is formed on the first insulating layer.

In sub-step 2023, a second insulating layer and a first source/drain electrode are sequentially formed on the base substrate on which the first active layer is formed.

Here, the thickness of the first insulating layer is greater than the thickness of the second insulating layer.

In summary, the present disclosure provides a method for manufacturing an array substrate. The array substrate includes a base substrate and a driving thin-film transistor disposed on the base substrate. The driving thin-film transistor includes a first gate, a first insulating layer, a first active layer, a second insulating layer, and a first source/drain electrode which are sequentially laminated on the base substrate. The thickness of the first insulating layer is greater than the thickness of the second insulating layer. Therefore, the regulating ability of the first gate of the driving thin-film transistor over the first active layer is reduced, and the subthreshold swing of the driving thin-film transistor is increased, thereby improving the adjusting ability of the driving thin-film transistor over the grayscale of the light-emitting device on the display panel.

Figure 8:
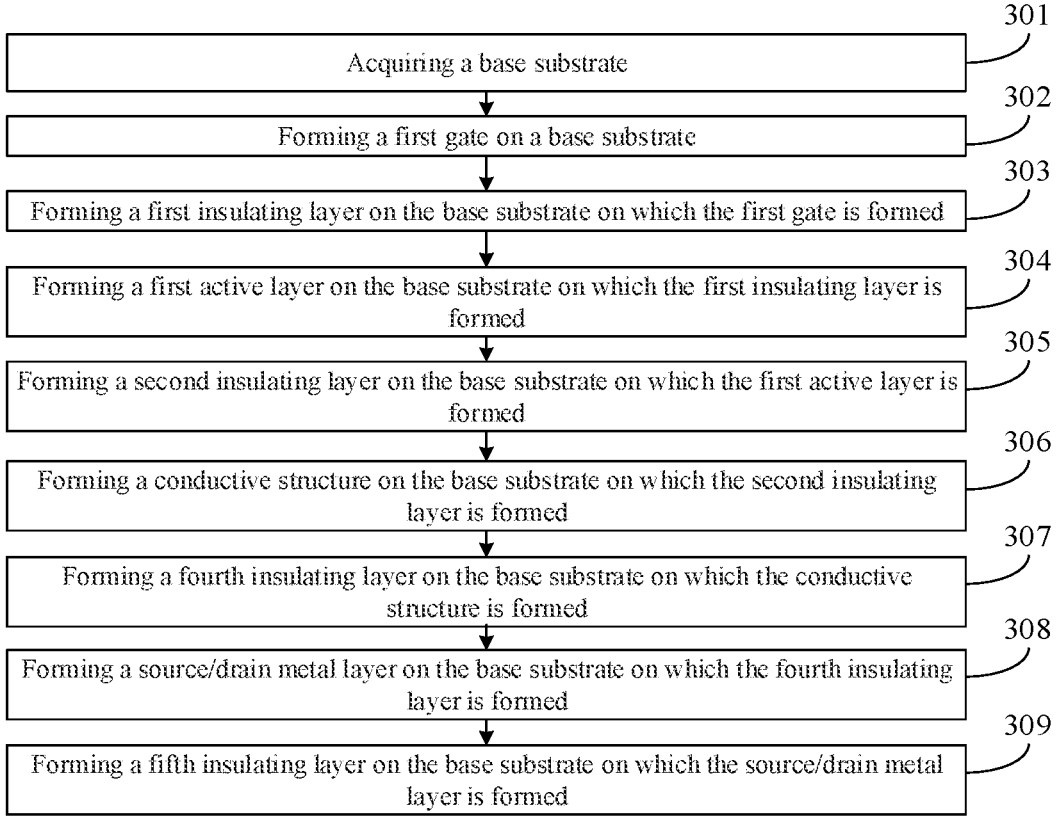
FIG. 8 is a flowchart of another method for manufacturing an array substrate according to some embodiments of the present disclosure.

FIG. 8 is a flowchart of another method for manufacturing an array substrate according to some embodiments of the present disclosure. The method is applicable to manufacturing the array substrates provided in the above embodiments, for example, the array substrate shown in FIG. 4 or FIG. 5. Referring to FIG. 8, the method includes the following steps.

In step 301, a base substrate is acquired.

Optionally, the base substrate is a flexible substrate. The flexible substrate is made from a flexible material (e.g., polyimide (PI) material). Alternatively, the base substrate is a glass substrate. Alternatively, the base substrate is an opaque substrate.

In step 302, a first gate is formed on a base substrate.

After the base substrate is cleaned by a standard method, a first gate metal film is formed on the base substrate by a sputtering deposition process or an atomic layer deposition (ALD) process, and then the first gate metal film is patterned to acquire the first gate. The thickness of the first gate ranges from 500 angstroms to 2000 angstroms, and the material of the first gate includes at least one of aluminum (Al), molybdenum (Mo), titanium (Ti), a molybdenum-niobium (MoNb) alloy and other metals.

In step 303, a first insulating layer is formed on the base substrate on which the first gate is formed.

A first insulating film is deposited on the base substrate on which the first gate is formed by a plasma enhanced chemical vapor deposition (PECVD) process or a plasma enhanced atomic layer deposition (PEALD) process. The material of the first insulating film includes at least one of silicon oxide (SiOx) or nitrogen oxide (SiNx). Then, the first insulating film is patterned to form the first insulating layer. The first insulating layer is a composite film layer, and the thickness of the first insulating layer ranges from 2000 angstroms to 5000 angstroms.

In step 304, a first active layer is formed on the base substrate on which the first insulating layer is formed.

Optionally, the first active layer is formed on the base substrate on which the first insulating layer is formed in an environment with an oxygen concentration greater than or equal to 20%. As such, the interface defects of the first active layer are increased, and the interface defects can store and release charges. When the interface defects are increased, the grain boundary capacitance of the active layer is increased. Since the grain boundary capacitance of the active layer is in direct proportion to the subthreshold swing of the driving thin-film transistor, the subthreshold swing of the driving thin-film transistor is increased.

In the embodiments of the present disclosure, the first active layer is formed in the following two ways.

Way I:

(1) A first semiconductor material layer and a second semiconductor material layer are sequentially formed on the base substrate on which the first insulating layer is formed by the sputtering deposition process or ALD process. The thickness of the first semiconductor material layer ranges from 10 nm to 80 nm, and the material of the first semiconductor material layer includes an oxide semiconductor material with a mobility ranging from 20 cm²(V·s) to 100 cm/(V·s). The thickness of the second semiconductor material layer ranges from 10 nm to 80 nm, and the material of the second semiconductor material layer includes an oxide semiconductor material with a mobility ranging from 5 cm²/(V·s) to 30 cm²/(V·s).

(2) The first semiconductor material layer and the second semiconductor material layer are patterned to form a first semiconductor layer and a second semiconductor layer. The second semiconductor layer covers the surface of the first semiconductor layer away from the base substrate. As such, the first semiconductor layer and the second semiconductor layer are formed by the one-time patterning process, which can simply the manufacturing process of the array substrate.

Way II:

(1) A first semiconductor material layer is formed on the base substrate on which the first insulating layer is formed.

The first semiconductor material layer is formed on the base substrate on which the first insulating layer is formed by the sputtering deposition process or ALD process. The thickness of the first semiconductor material layer ranges from 10 nm to 80 nm and the material of the first semiconductor material layer includes an oxide semiconductor material with a mobility ranging from 20 cm²/(V·s) to 100 cm²/(V·s).

(2) The one-time patterning process is performed on the first semiconductor material lay er to form the first semiconductor layer.

(3) A second semiconductor material layer is formed on the base substrate on which the first semiconductor layer is formed.

The second semiconductor material layer is formed on the base substrate on which the first semiconductor layer is formed by the sputtering deposition process or ALD process. The thickness of the second semiconductor material layer ranges from 10 nm to 80 nm, and the material of the second semiconductor material layer includes an oxide semiconductor material with a mobility ranging from 5 cm²/(V·s) to 30 cm/(V·s).

(4) The one-time patterning process is performed on the second semiconductor material layer to form the second semiconductor layer.

The first semiconductor layer has a top surface and a bottom surface which are opposite to each other, and a side surface connecting the top surface and the bottom surface. The bottom surface faces towards the base substrate, and the second semiconductor layer covers the top surface and the side surface of the first semiconductor layer.

In step 305, a second insulating layer is formed on the base substrate on which the first active layer is formed.

The thickness of the first insulating layer is greater than the thickness of the second insulating layer. The material of the second insulating layer includes silicon oxide, and the thickness of the second insulating layer ranges from 80 nm to 200 nm.

In step 306, a conductive structure is formed on the base substrate on which the second insulating layer is formed.

A conductive metal film is formed on the base substrate on which the second insulating layer is formed by the sputtering deposition process or ALD process, and then the conductive metal film is patterned to acquire the conductive structure. The thickness of the conductive structure ranges from 100 nm to 1000 nm, and the material of the conductive structure includes at least one of aluminum (Al), molybdenum (Mo), titanium (Ti), a molybdenum-nickel-titanium (MoNiTi, MTD) alloy, copper (Cu), a molybdenum-niobium (MoNb) alloy and other metals.

In step 307, a fourth insulating layer is formed on the base substrate on which the conductive structure is formed.

The fourth insulating layer is formed on the base substrate on which the conductive structure is formed by the PECVD process. The thickness of the fourth insulating layer ranges from 200 nm to 600 nm, and the material of the fourth insulating layer includes at least one of silicon oxide and silicon nitride.

In step 308, a source/drain metal layer is formed on the base substrate on which the fourth insulating layer is formed.

The source/drain metal layer includes a first source and a first drain. A source/drain metal film is formed on the base substrate on which the active layer is formed by the sputtering deposition process or ALD process. The thickness of the source/drain metal film ranges from 100 nm to 1000 nm, and the material of the source/drain metal film includes at least one of aluminum (Al), molybdenum (Mo), titanium (Ti), a molybdenum-nickel-titanium (MoNiTi, MTD) alloy, copper (Cu), a molybdenum-niobium (MoNb) alloy and other metals. Then, the source/drain metal film is patterned to form the source/drain metal layer.

In step 309, a fifth insulating layer is formed on the base substrate on which the source/drain metal layer is formed.

The fifth insulating layer is formed on the base substrate on which the source/drain metal layer is formed by the PECVD process. The thickness of the fifth insulating layer ranges from 200 nm to 600 nm, and the material of the fifth insulating layer includes at least one of silicon oxide and silicon nitride.

Figure 9:
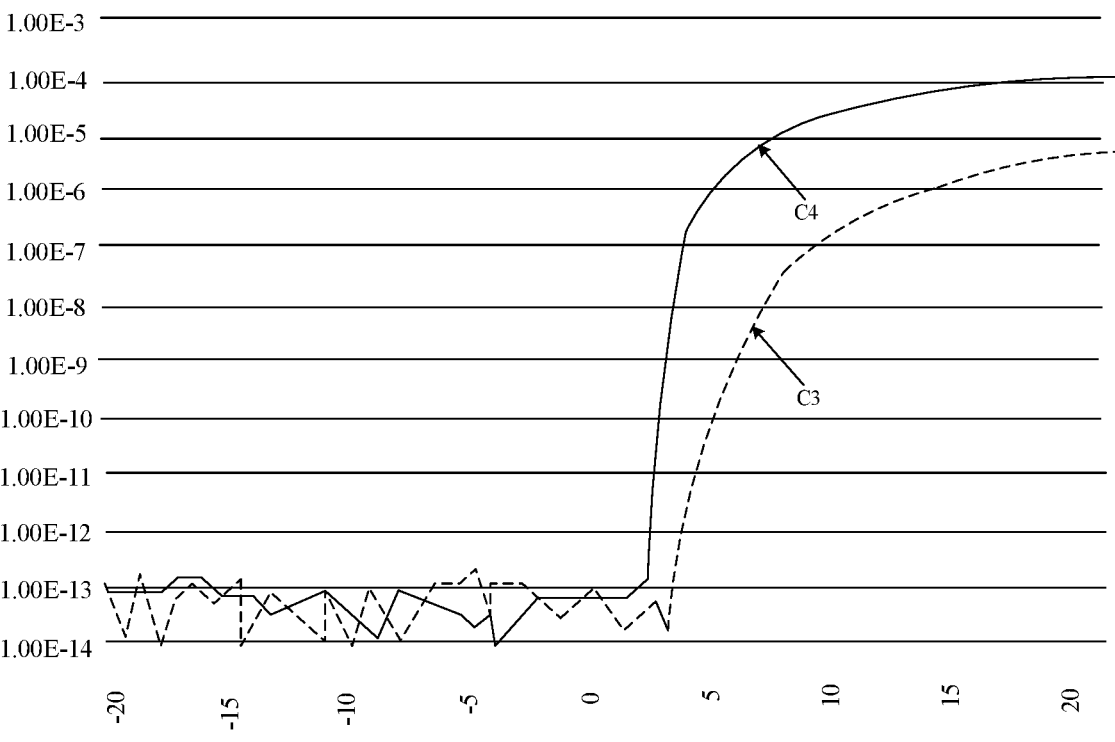
FIG. 9 is a comparison diagram of switching characteristics between a driving thin-film transistor manufactured according to some embodiments of the present disclosure and a driving thin-film transistor manufactured according to the related art.

FIG. 9 is a comparison diagram of switching characteristics between a driving thin-film transistor manufactured according to some embodiments of the present disclosure and a driving thin-film transistor manufactured according to the related art. In FIG. 9, the abscissa represents voltage, in volts (V), and the ordinate represents current, in Ampere (A). In FIG. 9, curve C3 shows a change curve of the drain current with the gate voltage of the driving thin-film transistor in the embodiments of the present disclosure, and curve C4 shows a change curve of the drain current with the gate voltage of the driving thin-film transistor with a top-gate structure prepared in the related art.

As can be seen from FIG. 9, when the gate voltage of the driving thin-film transistor is positive and the driving thin-film transistor is turned on, the driving thin-film transistor prepared according to the embodiments of the present disclosure has a larger subthreshold swing (equivalent to the slope of the curve in the figure) than the driving thin-film transistor prepared according to the related art. Through test, the subthreshold swing of the driving thin-film transistor in the embodiments of the present disclosure ranges from 0.25 mV/dec to 0.8 mV/dec, and the subthreshold swing of the driving thin-film transistor in the related art ranges from 0.15 mV/dec to 0.25 mV/dec.

In summary, the embodiments of the present disclosure provide a method for manufacturing an array substrate. The array substrate includes a base substrate and a driving thin-film transistor disposed on the base substrate. The driving thin-film transistor includes a first gate, a first insulating layer, a first active layer, a second insulating layer, and a first source/drain electrode which are sequentially laminated on the base substrate. The thickness of the first insulating layer is greater than the thickness of the second insulating layer. Therefore, the regulating ability of the first gate of the driving thin-film transistor over the first active layer is reduced, and the subthreshold swing of the driving thin-film transistor is increased, thereby improving the adjusting ability of the driving thin-film transistor over the grayscale of the light-emitting device on the display panel.

Figure 10:
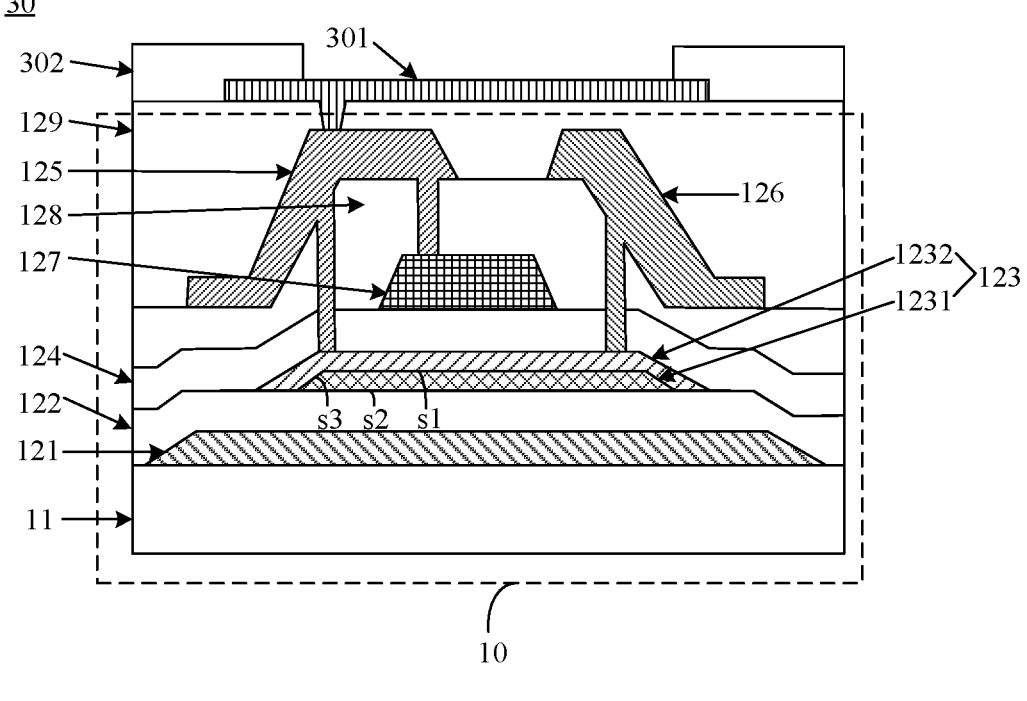
FIG. 10 is a schematic structural diagram of a display panel according to some embodiments of the present disclosure.

FIG. 10 is a schematic structural diagram of a display panel according to some embodiments of the present disclosure. As shown in FIG. 10, the display panel 30 includes the array substrate 10 as described in any one of the above embodiments.

The display panel 30 further includes a first electrode 301 disposed on the side, away from the base substrate 11, of the fifth insulating layer 129 of the array substrate 10. The first electrode 301 is an anode of a light-emitting unit on the display panel 30. The anode is formed by depositing ITO with a thickness of 40 nm or 135 nm by a sputtering deposition process, or the anode is a laminated structure of ITO, Ag, and ITO with thicknesses of 70 angstroms, 1000 angstroms, and 70 angstroms respectively.

A pixel defining layer (PDL) 302 is further provided on the side of the first electrode 301 away from the base substrate 11. The pixel defining layer 302 is provided with a pixel opening, and the pixel opening is provided with a light-emitting material therein. A second electrode is further provided on the side of the light-emitting material away from the base substrate 11, the second electrode is the cathode of the light-emitting unit, and the cathode is a full-layer structure. The thickness of the pixel defining layer ranges from 1 micron (um) to 2 um, and the material of the pixel defining layer includes PI.

The fifth insulating layer 129 is provided with a via hole therein, and the via hole exposes the first source 125, such that the first electrode 301 is electrically connected with the first source 125 via the via hole.

In summary, the embodiments of the present disclosure provide a display panel. The display panel includes an array substrate. The array substrate includes a base substrate and a driving thin-film transistor disposed on the base substrate. The driving thin-film transistor includes a first gate, a first insulating layer, a first active layer, a second insulating layer, and a first source/drain electrode which are sequentially laminated on the base substrate. The thickness of the first insulating layer is greater than the thickness of the second insulating layer. Therefore, the regulating ability of the first gate of the driving thin-film transistor over the first active layer is reduced, and the subthreshold swing of the driving thin-film transistor is increased, thereby improving the adjusting ability of the driving thin-film transistor over the grayscale of the light-emitting device on the display panel.

The embodiments of the present disclosure provide a display device, including the display panel in the foregoing embodiments. Optionally, the display device includes a product or component having a display function, such as an OLED display panel, a liquid crystal display panel, an electronic paper, a cell phone, a tablet computer, a television, a laptop computer, a digital photo frame, a navigator or the like.

The terms "at least one of A and B" in the present disclosure merely describes an association relationship between associated objects, indicating three kinds of relationships. For example, "at least one of A and B" means that A exists alone, A and B exist concurrently, and B exists alone. Similarly, "at least one of A, B, and C" indicates seven kinds of relationships, and means that A exists alone, B exists alone, C exists alone, A and B exist concurrently. A and C exist concurrently, C and B exist concurrently, and A, B and C exist concurrently. Similarly, "at least one of A, B, C, and D" indicates fifteen kinds of relationships, and means that A exists alone, B exists alone, C exists alone, D exists alone, A and B exist concurrently, A and C exist concurrently, A and D exist concurrently, C and B exist concurrently, D and B exist concurrently, C and D exist concurrently, A, B and C exist concurrently, A, B and D exist concurrently, A, C and D exist concurrently, B, C and D exist concurrently, and A, B, C and D exist concurrently.

It should be noted that in the accompanying drawings, the dimensions of layers and regions may be exaggerated for the clarity of illustration. Moreover, it is to be understood that when an element or a layer is referred to as "on" another element or layer, the element or layer may be directly arranged on the other element, or there may be an intermediate layer. In addition, it is to be understood that when an element or a layer is referred to as "below" another element or layer, the element or layer may be directly arranged below the other element, or there may be more than one intermediate layer or element. In addition, understandably, when a layer or an element is referred to as "between" two layers or two elements, the layer or element may be the only layer between the two layers or two elements, or there may be more than one intermediate layer or element. Similar reference numerals indicate similar elements throughout.

The terms "first", "second", "third" and "fourth" used in the present disclosure are merely used for descriptive purposes, but not denote or imply any relative importance. The term "a plurality of" means two or more, unless otherwise expressly specified.

The above descriptions are merely optional embodiments of the present disclosure, but are not intended to limit the present disclosure. Any modifications, equivalent substitutions, improvements and the like made within the spirit and principles of the present disclosure should be included within the scope of protection of the present disclosure.

What is claimed is:

1. An array substrate, comprising:
   a base substrate and a driving thin-film transistor disposed on the base substrate, wherein
   the driving thin-film transistor comprises a first gate, a first insulating layer, a first active layer, a second insulating layer, and a first source/drain electrode which are sequentially laminated on the base substrate, a thickness of the first insulating layer being greater than a thickness of the second insulating layer, and the thickness of the first insulating layer being positively correlated with a subthreshold swing of the driving thin-film transistor;
   the driving thin-film transistor further comprises a conductive structure disposed between the second insulating layer and the first source/drain electrode, wherein an orthographic projection of the conductive structure on the base substrate is overlapped with an orthographic projection of the first gate on the base substrate; and the first source/drain electrode comprises a first electrode electrically connected with a power supply and a second electrode electrically connected with a light-emitting unit, the second electrode being electrically connected with the conductive structure; and
   the driving thin-film transistor further comprises a fourth insulating layer disposed between the conductive structure and the first source/drain electrode, both the fourth insulating layer and the second insulating layer are provided with a plurality of through holes, the first electrode and the second electrode are connected to the first active layer via the trough holes in the fourth insulating layer and the second insulating layer, and the second electrode is further connected to the conductive structure via the through holes in the fourth insulating layer.

2. The array substrate according to claim 1, further comprising: a switching thin-film transistor disposed on the base substrate, wherein
   the switching thin-film transistor comprises a second active layer, a third insulating layer, a second gate, and a second source/drain electrode which are sequentially laminated on the base substrate, the third insulating layer and the second insulating layer being disposed in a same layer.

3. The array substrate according to claim 1, wherein a ratio of the thickness of the first insulating layer to the thickness of the second insulating layer ranges from 1.2 to 5.

4. The array substrate according to claim 1, wherein the first active layer comprises a first semiconductor layer and a second semiconductor layer sequentially laminated in a direction away from the base substrate, wherein a mobility of the first semiconductor layer is greater than a mobility of the second semiconductor layer; and the second semiconductor layer covers a surface of the first semiconductor layer away from the base substrate.

5. The array substrate according to claim 4, wherein the first semiconductor layer comprises a top surface and a bottom surface which are opposite to each other, and a side surface connecting the top surface and the bottom surface, the bottom surface facing towards the base substrate; and the second semiconductor layer covers the top surface and the side surface of the first semiconductor layer.

6. The array substrate according to claim 4, wherein the mobility of the first semiconductor layer ranges from 20 cm$^2$/(V·s) to 100 cm$^2$/(V·s) and the mobility of the second semiconductor layer ranges from 5 cm$^2$/(V·s) to 30 cm$^2$/(V·s).

7. A method for manufacturing an array substrate, comprising:

acquiring a base substrate;

forming a driving thin-film transistor on the base substrate;

wherein forming the driving thin-film transistor comprises:

sequentially forming a first gate and a first insulating layer which are laminated;

forming a first active layer on the first insulating layer; and sequentially forming a second insulating layer and a first source/drain electrode on the base substrate on which the first active layer is formed;

wherein a thickness of the first insulating layer is greater than a thickness of the second insulating layer, and the thickness of the first insulating layer is positively correlated with a subthreshold swing of the driving thin-film transistor;

the driving thin-film transistor further comprises a conductive structure disposed between the second insulating layer and the first source/drain electrode, wherein an orthographic projection of the conductive structure on the base substrate is overlapped with an orthographic projection of the first gate on the base substrate; and the first source/drain electrode comprises a first electrode electrically connected with a power supply and a second electrode electrically connected with a light-emitting unit, the second electrode being electrically connected with the conductive structure; and the driving thin-film transistor further comprises a fourth insulating layer disposed between the conductive structure and the first source/drain electrode, both the fourth insulating layer and the second insulating layer are provided with a plurality of through holes, the first electrode and the second electrode are connected to the first active layer via the trough holes in the fourth insulating layer and the second insulating layer, and the second electrode is further connected to the conductive structure via the through holes in the fourth insulating layer.

8. The method according to claim 7, wherein forming the first active layer on the first insulating layer comprises:

forming the first active layer on the base substrate on which the first insulating layer has formed in an environment with an oxygen concentration greater than or equal to 20%.

9. The method according to claim 7, wherein forming the first active layer on the first insulating layer comprises:

sequentially forming a first semiconductor material layer and a second semiconductor material layer on the base substrate on which the first insulating layer has formed; and performing a one-time patterning process on the first semiconductor material layer and the second semiconductor material layer to form a first semiconductor layer and a second semiconductor layer;

wherein the second semiconductor layer covers a surface of the first semiconductor layer away from the base substrate.

10. A display panel, comprising an array substrate, wherein the array substrate comprises:

a base substrate and a driving thin-film transistor disposed on the base substrate, wherein the driving thin-film transistor comprises a first gate, a first insulating layer, a first active layer, a second insulating layer, and a first source/drain electrode which are sequentially laminated on the base substrate, a thickness of the first insulating layer being greater than a thickness of the second insulating layer, and the thickness of the first insulating layer being positively correlated with a subthreshold swing of the driving thin-film transistor;

the driving thin-film transistor further comprises a conductive structure disposed between the second insulating layer and the first source/drain electrode, wherein an orthographic projection of the conductive structure on the base substrate is overlapped with an orthographic projection of the first gate on the base substrate; and the first source/drain electrode comprises a first electrode electrically connected with a power supply and a second electrode electrically connected with a light-emitting unit, the second electrode being electrically connected with the conductive structure; and the driving thin-film transistor further comprises a fourth insulating layer disposed between the conductive structure and the first source/drain electrode, both the fourth insulating layer and the second insulating layer are provided with a plurality of through holes, the first electrode and the second electrode are connected to the first active layer via the trough holes in the fourth insulating layer and the second insulating layer, and the second electrode is further connected to the conductive structure via the through holes in the fourth insulating layer.

11. A display device, comprising the display panel as defined in claim 10.

12. The display panel according to claim 10, wherein the array substrate further comprises: a switching thin-film transistor disposed on the base substrate, wherein the switching thin-film transistor comprises a second active layer, a third insulating layer, a second gate, and a second source/drain electrode which are sequentially laminated on the base substrate, the third insulating layer and the second insulating layer being disposed in a same layer.

13. The display panel according to claim 10, wherein a ratio of the thickness of the first insulating layer to the thickness of the second insulating layer ranges from 1.2 to 5.

14. The display panel according to claim 10, wherein the first active layer comprises a first semiconductor layer and a second semiconductor layer sequentially laminated in a direction away from the base substrate, wherein a mobility of the first semiconductor layer is greater than a mobility of the second semiconductor layer.

15. The display panel according to claim 14, wherein the second semiconductor layer covers a surface of the first semiconductor layer away from the base substrate.

16. The display panel according to claim 14, wherein the first semiconductor layer comprises a top surface and a bottom surface which are opposite to each other, and a side surface connecting the top surface and the bottom surface, the bottom surface facing towards the base substrate; and the second semiconductor layer covers the top surface and the side surface of the first semiconductor layer.

17. The display panel according to claim 14, wherein the mobility of the first semiconductor layer ranges from 20 cm$^2$/(V·s) to 100 cm$^2$/(V·s) and the mobility of the second semiconductor layer ranges from 5 cm$^2$/(V·s) to 30 cm$^2$/(V·s).

* * * * *